United States Patent
Hartwig

(10) Patent No.: US 7,183,594 B2
(45) Date of Patent: Feb. 27, 2007

(54) CONFIGURABLE GATE ARRAY CELL WITH EXTENDED POLY GATE TERMINAL

(75) Inventor: Elisabeth Hartwig, Buch am Buchrain (DE)

(73) Assignee: Infineon Technologies AG, Munich (DE)

( * ) Notice: Subject to any disclaimer, the term of this patent is extended or adjusted under 35 U.S.C. 154(b) by 7 days.

(21) Appl. No.: 11/058,911

(22) Filed: Feb. 16, 2005

(65) Prior Publication Data

US 2005/0189569 A1 Sep. 1, 2005

(30) Foreign Application Priority Data

Feb. 16, 2004 (DE) ...................... 10 2004 007 398

(51) Int. Cl.
*H01L 27/10* (2006.01)
(52) U.S. Cl. ...................... 257/204; 257/202; 257/210; 257/208; 257/E27.108
(58) Field of Classification Search ........ 257/202–209, 257/E27.108
See application file for complete search history.

(56) References Cited

U.S. PATENT DOCUMENTS

| | | | |
|---|---|---|---|
| 4,668,972 A * | 5/1987 | Sato et al. ................. | 257/369 |
| 5,079,614 A * | 1/1992 | Khatakhotan ............... | 257/369 |
| 5,923,060 A | 7/1999 | Gheewala | |
| 2002/0063582 A1* | 5/2002 | Rikino et al. ............... | 326/113 |
| 2003/0109074 A1* | 6/2003 | Shiba et al. ................ | 438/22 |

FOREIGN PATENT DOCUMENTS

| JP | 58-137230 | * | 8/1983 |
|---|---|---|---|
| JP | 58137230 A | | 8/1983 |
| JP | 02266563 A | | 10/1990 |

\* cited by examiner

*Primary Examiner*—Jerome Jackson
*Assistant Examiner*—Paul Budd
(74) *Attorney, Agent, or Firm*—Brinks Hofer Gilson & Lione

(57) ABSTRACT

A configurable gate array cell contains at least two doping zones of a different conduction type and a poly gate terminal. In a plan view representation of the gate array cell, the poly gate terminal, with at least one section, extends further than the doping zones at least partly in the horizontal direction, thereby enabling improved contact-connection to the adjacent cells.

5 Claims, 3 Drawing Sheets

CONFIGURABLE GATE ARRAY CELL WITH EXTENDED POLY GATE TERMINAL

PRIORITY

This application claims the benefit of priority to German Patent Application 10 2004 007 398.8, filed on Feb. 16, 2004, herein incorporated by reference in its entirety.

TECHNICAL FIELD

This application relates to a configurable gate array cell. In particular, this application relates to a configurable gate array cell having an extended poly gate terminal.

BACKGROUND

A multiplicity of active and passive electronic components which are electrically connected to one another according to a circuit construction of greater or lesser complexity are arranged on semiconductor circuits or integrated circuits (ICs) which are incorporated in many electronic devices. The components are formed in a semiconductor substrate and the integrated circuit is generally arranged in a housing equipped with terminal pins towards the outside in order to be able to produce an electrical connection to other external electrical circuits.

As the complexity of the integrated circuit arises, it is accompanied by a concomitant increase in the requirements made of the electronic components with regard to miniaturization, functional complexity and faster processing of information. It therefore becomes more and more difficult to design a complex integrated circuit comprising millions of transistors, inter alia, which are all clocked at a very high clock frequency. In a first step, a logical and functional design of such an integrated circuit is carried out, whereupon a logic network with logic gate cells is designed as a further step in order to implement the logically designed circuit therein. In this case, a logic gate cell is usually a relatively small unit comprising a plurality of transistors and other components that are combined in order to be able to carry out a specific logic operation. The resulting network constructed from the logic gate cells is described by a network list in which the corresponding logic gate cells and their electrical connections to one another are specified without a concrete physical circuit layout of the integrated circuit.

In order to create a physical circuit layout from the network list generated, so-called place & route software tools are used. Typical place & route software tools firstly place all the logic cells into a region in the center of the integrated circuit. By subsequently shifting the individual cells, the best possible positional placement of all the cells is carried out by means of the software, so-called filler cells and bypass capacitances between ground potential and supply voltage potential being arranged between the logic cells in order to be able to improve the performance and reliability of the integrated circuit. Afterwards, the corresponding wirings taken from the network list are formed in one or more planes in order to produce the electrical connections between the logic cells.

As already mentioned, during the automatic placement of the cells in accordance with the network list by means of place & route tools, gaps occasionally arise between the individual logic cells. So-called dummy logic blocks may be arranged in these gaps. One disadvantage of such dummy logic blocks that are inserted into an existing logic by means of a metal redesign also resides in the fact that these blocks have to be created and placed separately—independently of the logic—and require additional space without having a function. Furthermore, it is disadvantageous that only a specific cell repertoire is possible and relatively long wiring paths may arise.

The gaps that arise may also be filled with configurable gate array cells that are freely configurable by virtue of a metal redesign and thereby afford the possibility of carrying out an ECO fix (engineering change order=redesign owing to defective logic function) with a relatively low outlay. By means of such an ECO fix, the logic function of the gate array cell can be reprogrammed and integrated into the existing design.

One disadvantage of the known configurable gate array cells, however, is that the possibilities for the terminals of the poly gates constitute a considerable restriction. In general, these poly gate terminals are fitted between the doping regions at the transition from the p-conducting to the n-conducting doping zone. In order to connect a doping terminal to the poly gate of the adjacent cell, this has to be done transversely with respect to the preferred plane of the wiring, as a result of which, as it were, the so-called tracks (wiring tracks) are cut and the width of the wiring channel is reduced.

U.S. Pat. No. 5,923,060 discloses a configurable gate array cell containing one or more transistors. The doping zones of the transistors have an additional prong-shaped region which, in a plan view representation, extends in the vertical direction beyond the ends of the gate regions in order to enable electrical contact-connection to supply lines. The gate regions may extend in a preferred direction with a first part over the doping zones of a transistor. A gate terminal containing a second part extends perpendicularly to the preferred direction of the first part and adjoining the first part in lug-type fashion. The second part is formed such that, in a plan view representation of the gate array cell, it extends in the horizontal direction maximally as far as the limits of the doping zones. A disadvantage of this gate array cell is that the poly gate terminals enable only a relatively inadequate possibility of connection to adjacent gate array cells. The poly gate terminals extend in particular in the horizontal direction maximally as far as the dimensions of the doping zones, as a result of which the contact-connection to other gate array cells can be carried out in a relatively complicated and inadequate manner.

BRIEF SUMMARY

A configurable gate array cell is provided which ensures an improved possibility for electrical connection to adjacent gate array cells. In particular, a poly gate terminal is provided which enables improved electrical contact-connection to adjacent gate array cells.

By way of introduction only, a configurable gate array cell comprises a doping zone of a first conduction type formed in a semiconductor substrate and a doping zone of a second conduction type, which are arranged along a preferred direction. The configurable gate array cell comprises at least one poly gate terminal extending in a plane parallel to the semiconductor substrate. The poly gate terminal has a plurality of contiguous sections, a first section extending along the preferred direction above the doping zones. A second section likewise extends in the preferred direction and in a manner laterally offset from the doping zones, and a third section is formed such that it connects the first and the second section to one another. In a plan view of the gate array cell, the second section thus runs beside the doping zones and preferably parallel to their side edges.

As a result, it is possible to provide a poly gate terminal which enables significantly improved contact-connection to adjacent gate array cells, in particular to the poly gate terminals of the said gate array cells. By virtue of the diverse possibilities for connection that are made possible by means of the lateral extension of the poly gate terminal beyond the dimensions of the doping zones, it is possible to realize complex and wiring-intensive logic functions in a very small space. What is more, the gate array cell with the extended poly gate terminal can be produced in relatively space-saving fashion.

In particular, the first and second sections are arranged parallel to one another at least partially in partial sections of their respective entire formation. The poly gate terminal comprising a plurality of sections can be configured in a flexible manner and it is thus possible to produce a poly gate terminal that is adapted in many ways and to the corresponding conditions and requirements and, as a result, also to produce a gate array cell that can be contact-connected flexibly and relatively simply.

It is thus provided that the second section extends laterally beside the doping zones. This considerably facilitates electrical contact-connection to other gate array cells of the integrated circuit. Direct wiring is made possible within the basic cell and the best possible performance and usability of the cell are maintained in this case, since the transistor widths are preserved virtually with no adverse effect.

In another embodiment, the poly gate terminal is formed in a H-shape. In this case, the third section extends as connecting piece essentially transversely with respect to the preferred direction of the first and the second section, in particular perpendicularly. As a result, it is possible to obtain a relatively short overall configuration, exhibiting low complexity, of the poly gate terminal of a gate array cell. Furthermore, this ensures a relatively simple connection which can be placed in a flexible manner between the first and second sections of the poly gate terminal.

A spacing is usually provided between the doping zones arranged next to one another in the preferred direction. It may then be provided that, in a plan view of the gate array cell, the third section is formed between the doping zones.

The first section of the poly gate terminal may be formed such that it is longer than the second section of the poly gate terminal in the preferred direction. The electrical contact-connection can thereby be carried out even more effectively with regard to the placement of the wirings and further required supply lines of the integrated circuit.

A plurality of wiring tracks may be formed essentially transversely with respect to the preferred direction of the first and the second section of the poly gate terminal. The first section of the poly gate terminal may be formed in such a way that it extends over all wiring tracks. The second section of the poly gate terminal may be formed such that it extends over a number of wiring tracks that is less than the total number of wiring tracks. An optimized wiring with regard to the requisite space requirement and the simplest possible electrical contact-connection can thereby be obtained. The second section formed beside the doping zones can thereby be formed and used with an optimally adapted length for the circuitry requirements that are respectively imposed.

In order to be able to realize simple production, the wiring tracks may be formed in a different plane of the integrated circuit from the sections of the poly gate terminal.

It is to be understood that both the foregoing general description and the following detailed description of the present invention are merely exemplary and are intended to provide further explanation of the invention as claimed.

BRIEF DESCRIPTION OF THE DRAWINGS

A plurality of embodiments of the invention are explained in more detail below with reference to schematic drawings, in which.

In the figures, identical or functionally identical elements are provided with the same reference symbols.

DETAILED DESCRIPTION OF THE DRAWINGS AND THE PRESENTLY PREFERRED EMBODIMENTS

Figure 1:
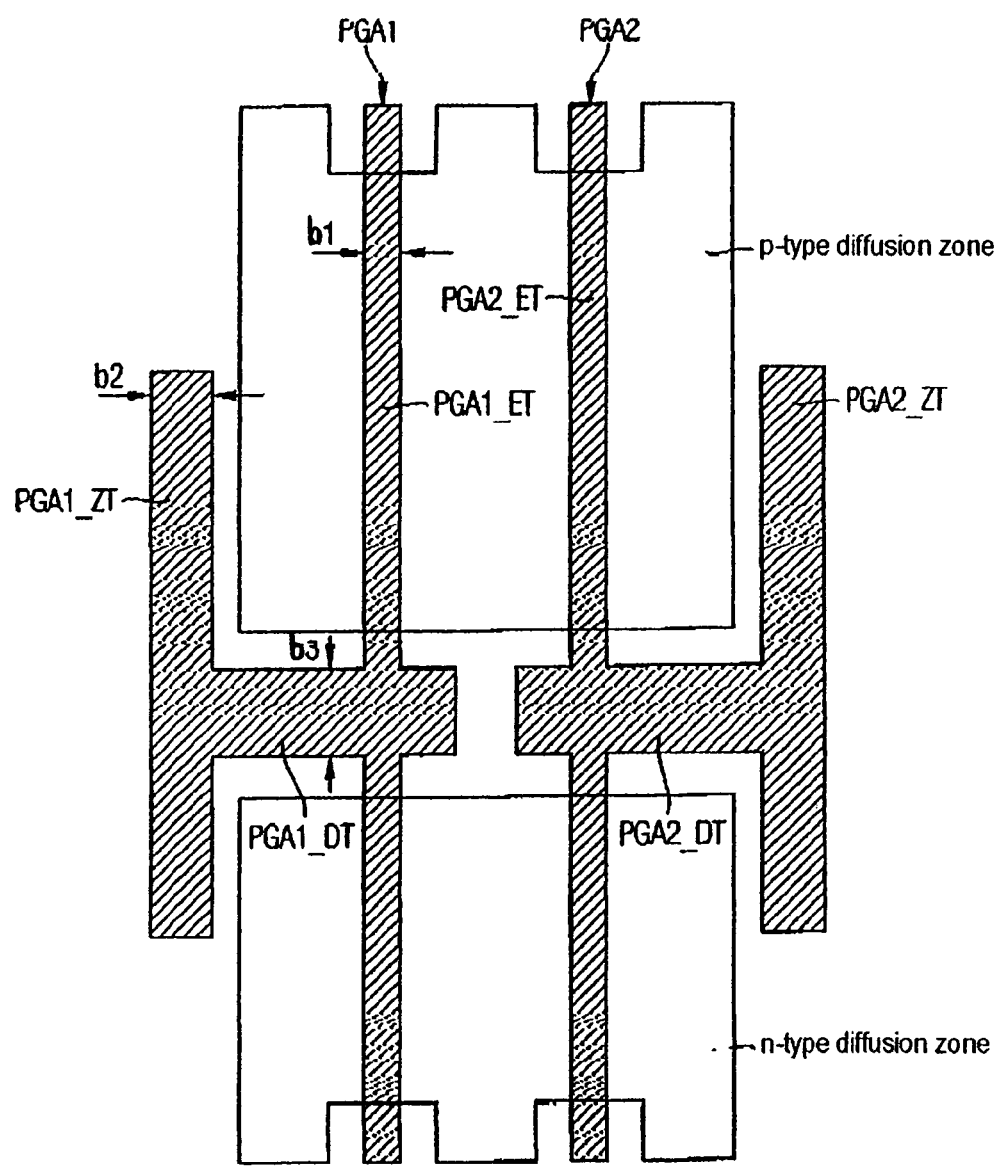
FIG. 1 shows a plan view representation of a first embodiment of a configurable gate array cell.

FIG. 1 shows a configurable gate array cell in a schematic plan view representation depicting some of the elements in the gate array cell. The gate array cell comprises a p-conducting doping zone formed in a substrate and an n-conducting doping zone formed in a substrate and an n-conducting doping zone. A first and a second poly gate terminal PGA1 and PGA2 respectively extend above the two doping zones, with the result that a freely programmable gate array cell having four gates is formed. Both poly gate terminals PGA1 and PGA2 have an H-shaped structure. In the embodiment, the first poly gate terminal PGA1 comprises a first section PGA1_ET extending in the longitudinal direction over the two doping zones. Furthermore, the poly gate terminal PGA1 comprises a second section PGA1_ZT extending completely beside the two doping zones. The second section PGA1_ZT is formed parallel to the first section PGA1_ET and extends parallel and at a distance on the left-hand side both partially along the p-type doping zone and along the n-type doping zone. In the embodiment of FIG. 1, the second section PGA_ZT of the first poly gate terminal PGA1 is formed such that it is shorter in the longitudinal direction than the first section PGA1_ET, but has a greater width b2 than the width b1 of the first second PGA1_ET. The first section PGA1_ET and the second section PGA1_2T are connected to one another by means of a third section PGA1_DT, the third section PGA1_DT being formed substantially perpendicular to the two sections PGA1_ET and PGA1_ZT. Furthermore, in the embodiment, the third section PGA1_DT extends between the two doping zones and has a greater width b3 than the widths b1 and b2 of the first section PGA1_ET and of the second section PGA2_ZT.

Furthermore, the first poly gate terminal PGA1 comprises a further section extending between the two doping zones with the same width b3 as the third section PGA1_DT in the transverse direction towards the second poly gate terminal PGA2. This further section constitutes, as it were, a continuation of the third section PGA1_DT on the opposite side of the first section PGA1_ET. As can be discerned in FIG. 1, the second poly gate terminal PGA2 is constructed symmetrically with respect to the poly gate terminal. The second poly gate terminal PGA2 analogously comprises a first section PGA2_ET, a second section PGA2_ZT and a third section PGA2_DT. The second poly gate terminal PGA2 also comprises a further section that is extended in the direction towards the first poly gate terminal PGA1 and, in this case as well, constitutes a horizontal continuation of the third section PGA2_DT on the opposite side of the first section PGA2_ET. In the case of both poly gate terminals PGA1 and PGA2 respectively, the geometrical configuration is such that their H-shaped formations have an outer vertical limb in the form of the respective second sections PGA 1_ZT and PGA2_ZT, respectively, which are shorter than the corresponding first sections PGA1_ET and PGA2_ET, respectively. The illustration in accordance with FIG. 1 is by way of example and both the doping zones and the poly gate terminals, in particular the respective section regions, may be formed in diverse fashions. Thus, by way of example, the second section PGA1_ZT may merely extend parallel to the p-type doping region and not have a parallel component with respect to the n-type doping region. The opposite case may also be provided, in which the second section of a poly gate terminal merely extends parallel to the n-type doping region. Further embodiments may result from the fact that the third sections of a poly gate terminal are not formed between the doping zones but rather above or at least partially above one or both doping zones. This shows that the poly gate terminals PGA1 and PGA2 can be adapted in diverse fashion to the respective requirements and be configured flexibly and, as desired, the larger horizontal extent of the poly gate terminal is to be embodied in relation to one or both doping zones.

FIG. 1 shows a configurable gate array cell in a schematic plan view representation depicting some of the elements in the gate array cell. The gate array cell comprises a p-conducting doping zone formed in a substrate and an n-conducting doping zone formed in a substrate and an n-conducting doping zone. A first and a second poly gate terminal PGA1 and PGA2 respectively extend above the two doping zones, with the result that a freely programmable gate array cell having four gates is formed. Both poly gate terminals PGA1 and PGA2 have an H-shaped structure. In the embodiment, the first poly gate terminal PGA1 comprises a first section $PGA1_{13}$ ET extending in the longitudinal direction over the two doping zones. Furthermore, the poly gate terminal PGA1 comprises a second section $PGA1_{13}$ ZT extending completely beside the two doping zones. The second section $PGA1_{13}$ ZT is formed parallel to the first section $PGA1_{13}$ ET and extends parallel and at a distance on the left-hand side both partially along the p-type doping zone and along the n-type doping zone. In the embodiment of FIG. 1, the second section $PGA1_{13}$ ZT of the first poly gate terminal PGA1 is formed such that it is shorter in the longitudinal direction than the first section $PGA1_{13}$ ET but has a greater width b2 than the width b1 of the first second $PGA1_{13}$ ET. The first section $PGA1_{13}$ ET and the second section $PGA1_{13}$ ZT are connected to one another by means of a third section $PGA1_{13}$ DT, the third section $PGA1_{13}$ DT being formed substantially perpendicular to the two sections $PGA1_{13}$ ET and $PGA1_{13}$ ZT. Furthermore, in the embodiment, the third section $PGA1_{13}$ DT extends between the two doping zones and has a greater width b3 than the widths b1 and b2 of the first section $PGA1_{13}$ ET and of the second section $PGA2_{13}$ ZT.

Figure 2:
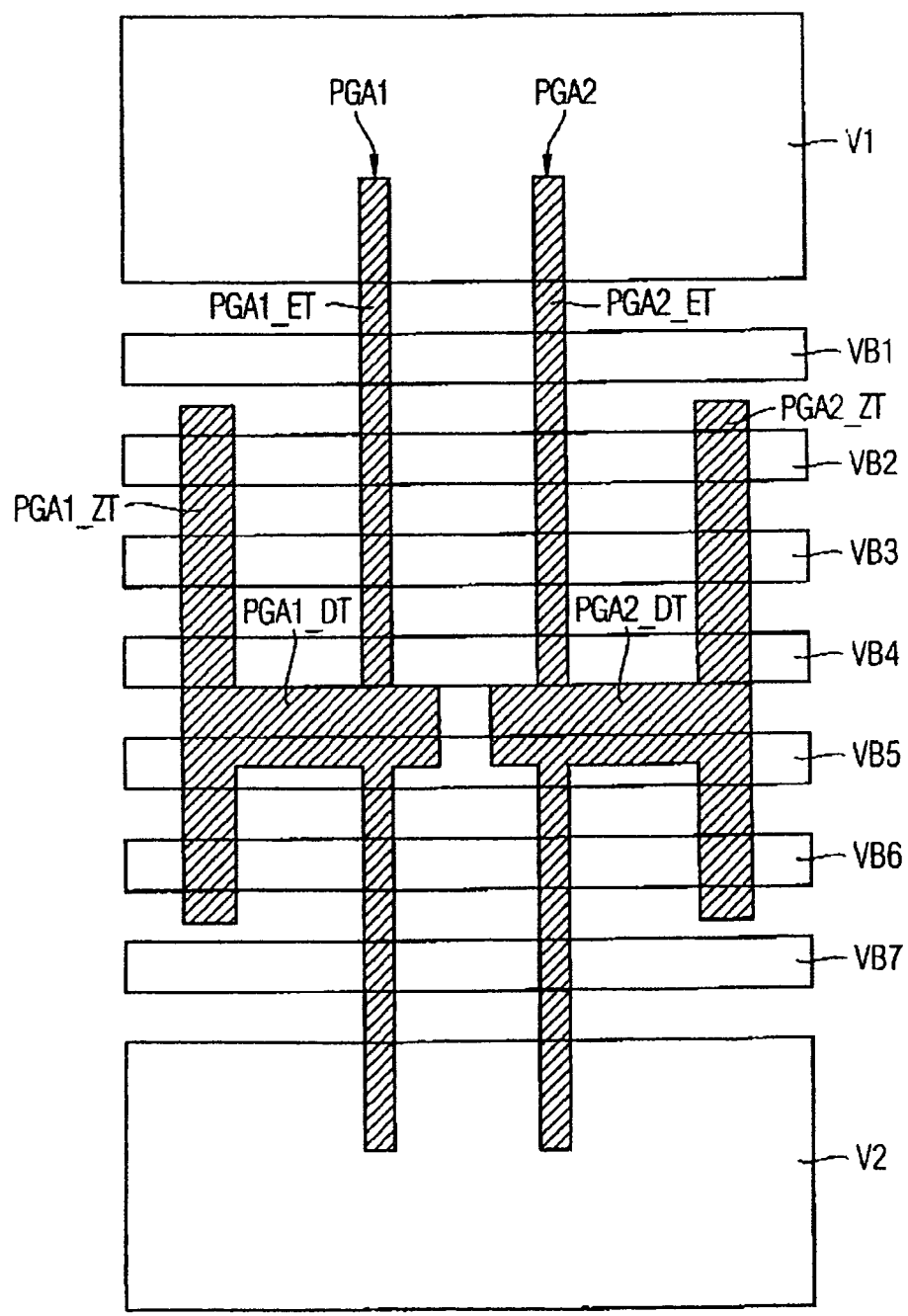
FIG. 2 shows a plan view representation of a second embodiment of a configurable gate array cell.

As is shown in FIG. 2, the poly gate terminals PGA1 and PGA2 or the section regions PGA1_ZT and PGA2_ZT are formed such that they extend in a perpendicular direction to and above the wiring tracks VB2 to VB6. These lengthened polyterminal lugs PGA1_ZT and PGA2_ZT make it possible to carry out direct wiring within the basic cell with the wiring tracks VB2 to VB6. In this case, the entire performance of the cell is preserved since the transistor widths of the transistors of the gate array cell are also preserved.

Figure 3:
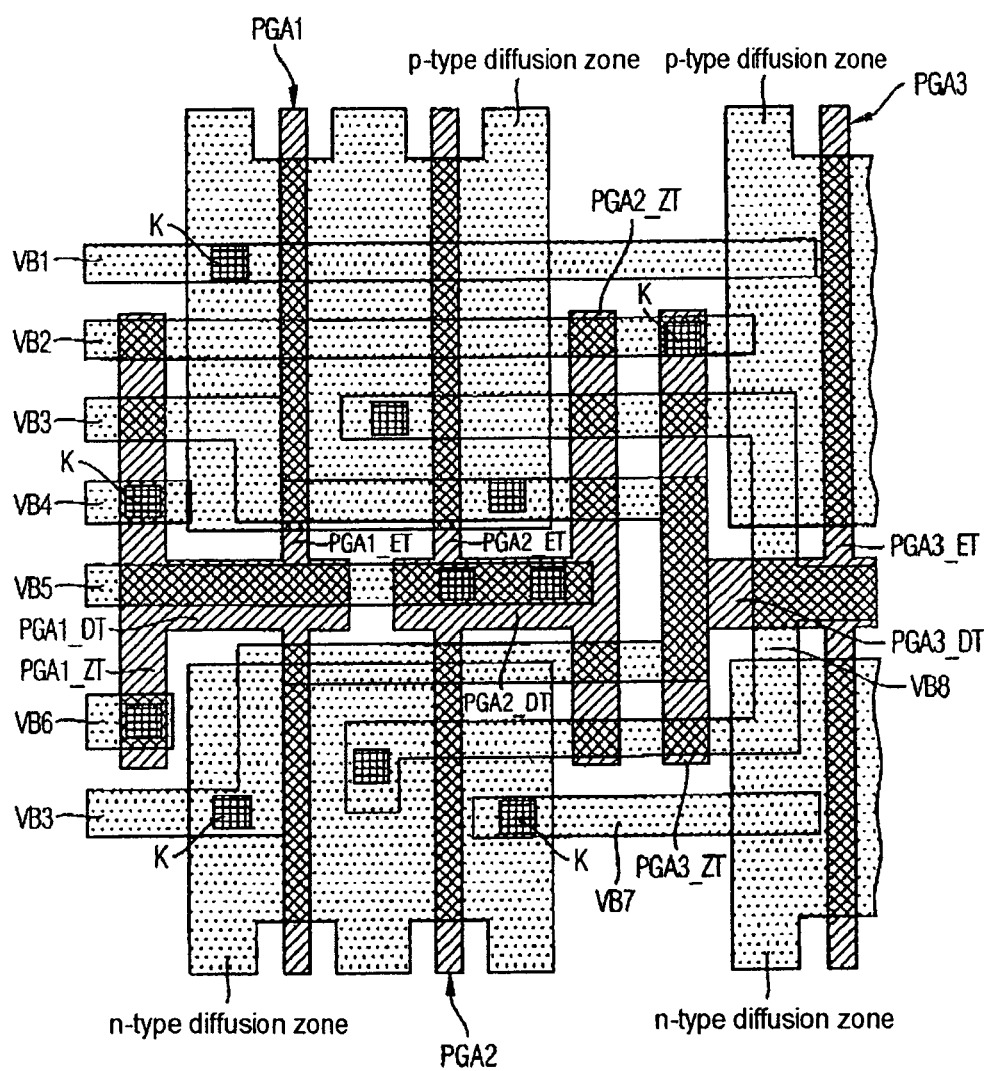
FIG. 3 shows a plan view representation of a third embodiment of a configurable gate array cell.

FIG. 3 illustrates a third embodiment, showing a possible wiring of a first gate array cell with a second gate array cell partially illustrated to the right thereof. The poly gate terminals PGA1 and PGA2 of the first gate array cell are constructed in accordance with the illustrated poly gate terminal PGA3 of the second gate array cell. As shown by the contact-connection illustrated by way of example, the second section PGA3_ZT of the poly gate terminal PGA3 is electrically connected to the second wiring track VB2 via the contact K. Furthermore, the wiring tracks VB1 and VB3 are contact-connected to the p-type doping zone of the first gate array cell via the contacts K, the wiring track VB3 additionally having a contact-connection to the n-type doping zone of the first gate array cell. The wiring tracks VB4 and VB6 are electrically connected to the second section and, respectively, to the polyterminal lug region PGA1_ZT of the first poly gate terminal PGA1. The second poly gate terminal PGA2 is contact-connected to the wiring track VB5 via two contacts K in its third section PGA2_DT, one of the two contacts K being electrically connected partially to the first section PGA2_ET and partially to the third section PGA2_DT. The n-type doping zone of the first gate array cell is contact-connected to the wiring track VB7 and the wiring track VB8 is in turn electrically contact-connected both to the p-type and to the n-type doping zone of the first gate array cell.

The diverse possibilities for connection make it possible to realize complex and wiring-intensive logic functions in a very confined space. Double contacts in the case of gates that are multiply connected in parallel become possible and improve the manufacturing yield. The basic cell as shown in FIG. 1, for example, is enlarged only insignificantly with regard to a design directed at an optimum manufacturing yield, on account of the horizontally extended poly gate terminals with polyterminal lugs (PGA1_ZT, PGA1_DT; PGA2_ZT, PGA2_DT).

The embodiments of the poly gate terminals as shown in FIGS. 1 to 3 are by way of example. The configuration of the poly gate terminal may be embodied in diverse fashion and with regard to the respective requirements such as, by way of example, different geometrical configurations of the doping regions or of the arrangement of the gate array cells with respect to one another in a circuit layout. The number of sections which the poly gate terminals have and what geometrical structure these represent in their interconnection may be altered as desired. However, at least one section region of the poly gate terminal projects beyond the horizontal dimensions of one or both doping zones, when considered from a plan view representation of the gate array cell, in order thus to enable significantly improved contact-connection to wiring tracks and adjacent gate array cells, in particular to the poly gate terminals thereof. This enables a layout design exhibiting lower complexity, on the one hand. On the other hand, the diverse possibilities for connection that are made possible by means of the extension of the poly gate terminal beyond the dimensions of the doping zones make is possible to realize complex and wiring-intensive logic functions in a very small space. What is more, the gate array cell with the extended poly gate terminal can be produced in relatively space-saving fashion.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. A configurable gate array cell comprising:
   a doping zone of a first conduction type formed in a semiconductor substrate and a doping zone of a second conduction type, which are arranged along a preferred direction; and
   a poly-silicon gate terminal extending in plane parallel to the semiconductor substrate, the poly-silicon gate terminal having a plurality of contiguous sections, a first section extending along the preferred direction above the doping zones, a second section extending in the preferred direction and laterally offset from the doping zones, and a third section connecting the first and second sections to one another, a plurality of wiring tracks formed substantially transversely with respect to the preferred direction of the first and second sections of the poly-silicon gate terminal,
   wherein the first section of the poly-silicon gate terminal extends over all of the wiring tracks, and the second section of the poly-silicon gate terminal extends over fewer than all of the wiring tracks, and wherein the wiring tracks are formed in a different plane than the first, second or third sections of the poly-silicon gate terminal.

2. The configurable gate array cell according to claim 1, wherein the third section extends as a connecting piece substantially transversely with respect to the preferred direction of the first and second sections.

3. The configurable gate array cell according to claim 1, wherein the poly gate terminal is H-shaped.

4. The configurable gate array cell according to claim 1, wherein the third section is formed between the doping zones.

5. The configurable gate array cell according to claim 1, wherein the first section of the poly gate terminal is longer than the second section in the preferred direction.

* * * * *

UNITED STATES PATENT AND TRADEMARK OFFICE
CERTIFICATE OF CORRECTION

| | | |
|---|---|---|
| PATENT NO. | : 7,183,594 B2 | Page 1 of 1 |
| APPLICATION NO. | : 11/058911 | |
| DATED | : February 27, 2007 | |
| INVENTOR(S) | : Elisabeth Hartwig | |

It is certified that error appears in the above-identified patent and that said Letters Patent is hereby corrected as shown below:

On the Title Page, Item (30)

Under "Foreign Application Priority Data", delete "10 2004 007 398" and substitute --10 2004 007 398.8-- in its place.

Signed and Sealed this

First Day of May, 2007

JON W. DUDAS
*Director of the United States Patent and Trademark Office*